United States Patent
Chen et al.

(10) Patent No.: US 10,032,777 B1
(45) Date of Patent: Jul. 24, 2018

(54) ARRAY OF DYNAMIC RANDOM ACCESS MEMORY CELLS

(71) Applicant: UNITED MICROELECTRONICS CORP., Hsin-Chu (TW)

(72) Inventors: Hsin-Wen Chen, Kaohsiung (TW); Chi-Chang Shuai, Hsinchu (TW); Hung-Chan Lin, Tainan (TW); Ting-Hao Chang, Hsinchu County (TW); Hsien-Hung Tsai, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/613,288

(22) Filed: Jun. 5, 2017

(51) Int. Cl.
  *H01L 27/108* (2006.01)
  *G06F 12/0846* (2016.01)

(52) U.S. Cl.
  CPC .... *H01L 27/10847* (2013.01); *G06F 12/0846* (2013.01); *H01L 27/10814* (2013.01)

(58) Field of Classification Search
  CPC ......... H01L 27/10847; H01L 27/10814; G06F 12/0846
  See application file for complete search history.

(56) References Cited

U.S. PATENT DOCUMENTS

| | | | |
|---|---|---|---|
| 6,781,181 B2 | 8/2004 | Heo | |
| 7,027,326 B2 | 4/2006 | Luk | |
| 8,009,459 B2 | 8/2011 | Wu | |
| 9,385,713 B2 | 7/2016 | Uesugi | |
| 9,478,276 B2 | 10/2016 | Onuki | |
| 2004/0137667 A1* | 7/2004 | Ogawa | H01L 27/0207 438/142 |
| 2010/0304539 A1* | 12/2010 | Matsuura | H01L 27/1085 438/243 |
| 2013/0264549 A1* | 10/2013 | Yamazaki | H01L 33/50 257/40 |
| 2016/0307906 A1* | 10/2016 | Kim | H01L 27/088 |
| 2017/0084614 A1 | 3/2017 | Wu | |

OTHER PUBLICATIONS

Ting-Chia Chang et al., Title: Semiconductor Memory Device, pending U.S. Appl. No. 15/479,253, filed Apr. 4, 2017.

* cited by examiner

*Primary Examiner* — Ajay Ojha
(74) *Attorney, Agent, or Firm* — Winston Hsu (57) ABSTRACT

An array of dynamic random access memory cells includes a first set of memory cell pairs in a first row, a second set of memory cells in a second row, and a first set of bit line contacts in the first row. The second set of memory cell pairs are disposed adjacent to the first set of memory cell pairs, and each two of the memory cell pairs in the second row include a common S/D region. Each of the first set of bit line contacts is electrically coupled to each of the common S/D regions of the memory cell pairs in the second row respectively.

18 Claims, 6 Drawing Sheets

ARRAY OF DYNAMIC RANDOM ACCESS MEMORY CELLS

BACKGROUND OF THE INVENTION

1. Field of the Invention

This application relates generally to an array of dynamic random access memory cells, and more particularly to an array of dynamic random access memory cells having oxide semiconductor field effect transistor.

2. Description of the Prior Art

Memory devices using semiconductor elements are broadly classified into two categories: a volatile memory device that loses stored data when power supply stops, and a non-volatile memory device that stores stored data even when power is not supplied.

A typical example of a volatile memory device is dynamic random access memory (DRAM), which typically includes a transistor and a capacitor. A DRAM stores data in such a manner that a transistor is selected and charge is stored in a capacitor. Since charge in a capacitor is lost when data is read from a DRAM, another writing operation should always be carried out whenever data is read out. Moreover, due to the transistor included in a memory element has leakage current and charge flows into or out of a capacitor even when the transistor is not selected, so that the data storing time is short. For that reason, another writing operation (refresh operation) is necessary at predetermined intervals, and it is difficult to reduce power consumption sufficiently.

In order to extend the data storing time of DRAM cells, the manufacturers in the DRAM industry have developed a novel DRAM cell structure which adopts oxide semiconductor field effect transistors (OSFETs). OSFET is a type of transistors that uses an oxide semiconductor layer containing at least indium (In) oxide or zinc (Zn) oxide as a carrier channel region. Because the off-current of the OSFET is usually $10^{10}$ times less than that of the conventional FET, the data storing time of DRAM cells with OSFET can be increased sufficient.

However, since the on-current of the OSFET is also $10^{10}$ times less than that of the conventional FET, the data stored in a capacitor of DRAM cell with OSFET becomes hard to be read out. Besides, the layout of the DRAM cells with OSFET also need to be modified in order to further increase the number of DRAM cells with OSFETs within a unit area of the semiconductor substrate.

SUMMARY OF THE INVENTION

To this end, there is a need to solve the problem disclosed above. According to one embodiment of the present invention, an array of dynamic random access memory cells is disclosed and includes a first set of memory cell pairs in a first row, a second set of memory cell pairs in a second row, and a first set of bit line contacts in the first row. The second set of memory cell pairs are disposed adjacent to the first set of memory cells, and each two of the memory cell pairs in the second row include a common S/D region. Each of the first set of bit line contacts is electrically coupled to each of the common S/D regions of the memory cell pairs in the second row respectively.

These and other objectives of the present invention will no doubt become obvious to those of ordinary skill in the art after reading the following detailed description of the preferred embodiment that is illustrated in the various figures and drawings.

DETAILED DESCRIPTION

Embodiments of the present invention will be described below. Note that one embodiment of the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Any of the embodiments described below can be combined as appropriate. In the case where some structure examples are given in one embodiment, any of the structure examples can be combined as appropriate, and any of the structure examples can be combined with one or more structure examples described in the other embodiments.

It will be understood that when an element or layer is referred to as being "on," "engaged to," "connected to" and/or "coupled to" another element or layer, it can be directly on, engaged, connected or coupled to the other element or layer or intervening elements or layers may be presented. In contrast, when an element is referred to as being "directly on," "directly engaged to," "directly connected to" and/or "directly coupled to" another element or layer, there are no intervening elements or layers present. Other words used to describe the relationship between elements should be interpreted in a like fashion (e.g., "between" versus "directly between," "adjacent" versus "directly adjacent," etc.) As used herein, the term "and/or" may include any and all combinations of one or more of the associated listed items.

In the drawings, the same components, components having similar functions, components formed of the same material, or components formed at the same time are sometimes denoted by the same reference numerals, and the description thereof is not repeated in some cases.

In the following paragraphs, an array of dynamic random access memory cells is described in detail.

Figure 1:
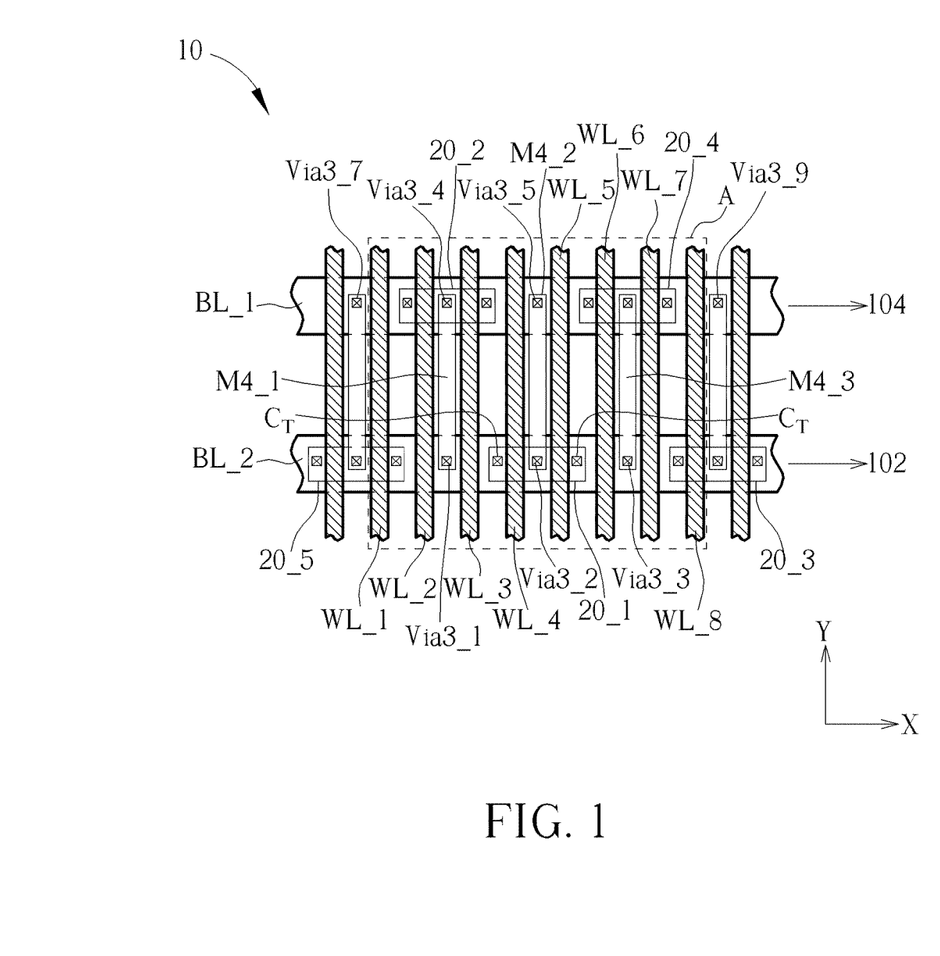
FIG. 1 is a top view of an array of DRAM cells according to one embodiment of the invention.
Figure 2:
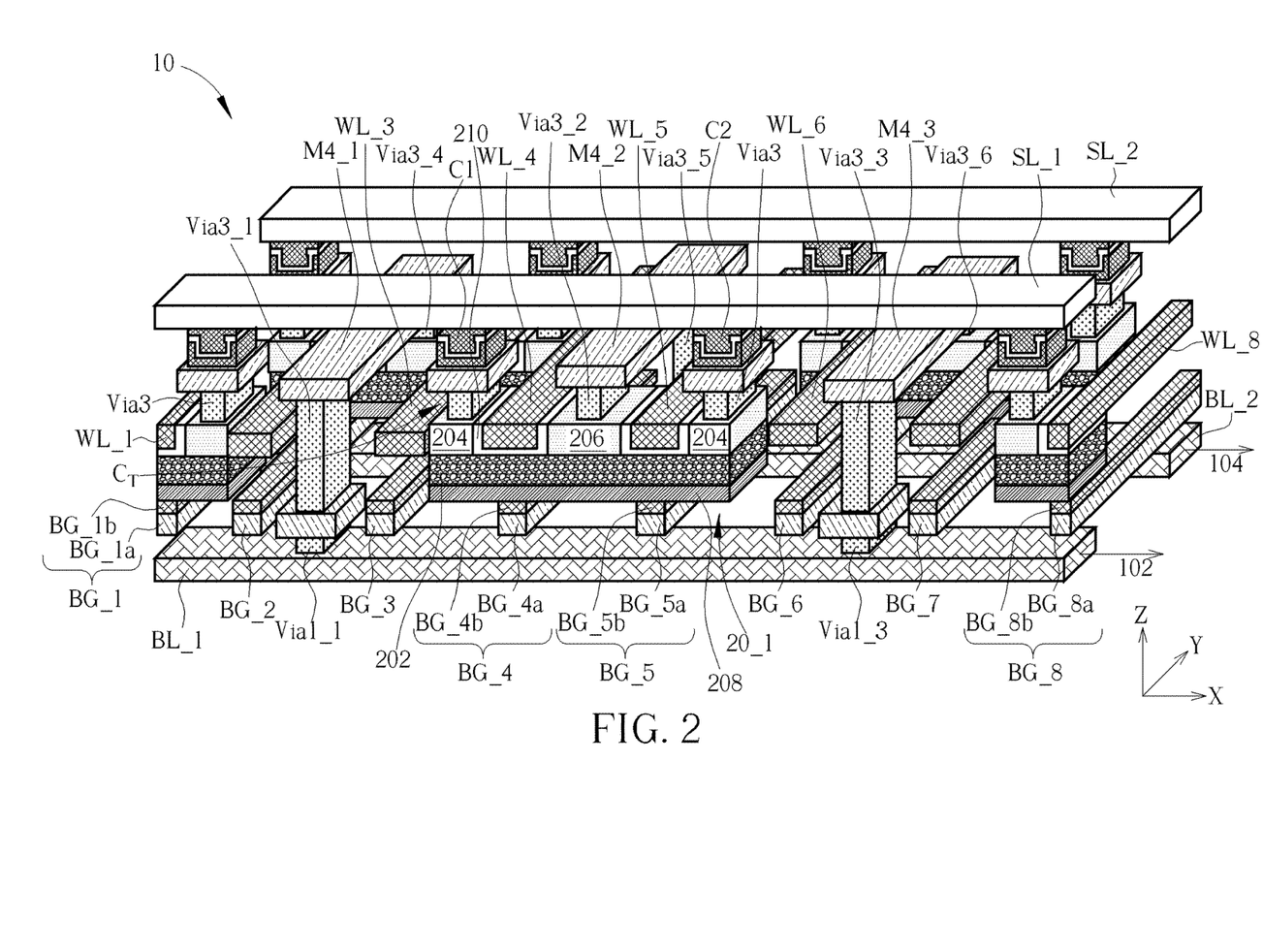
FIG. 2 is a perspective view of an array of dynamic random access memory (DRAM) cells according to one embodiment of the invention.

Please refer to FIG. 1 and FIG. 2. FIG. 1 is a top view of an array of DRAM cells according to one embodiment of the invention. FIG. 2 is a perspective view of an array of dynamic random access memory (DRAM) cells according to one embodiment of the invention. It should be noted that the structure enclosed in region A of FIG. 1 corresponds to the structure shown in FIG. 2. As shown in FIG. 1, a memory device 10 includes an array of memory cell pairs 20_1, 20_2, 20_3, 20_4, and 20_5 respectively distributed in a first row 102 and a second row 104. Specifically, a first set of memory cell pairs 20_1, 20_3, and 20_5 are distributed along the first row 102, and a second set of memory cell pairs 20_2 and 20_4 are distributed along the second row 102. Each memory cell pairs 20_1, 20_2 . . . 20_5 may be made of two memory cells. As shown in FIG. 1, each memory cell pair 20_1, 20_3, and 20_5 in the first row 102 and each memory cell pair 20_2 and 20_4 in the second row 104 respectively include two memory cells, which respectively include two field effect transistors and two capacitors. The capacitors may be coupled to the transistors through capacitor contacts $C_T$. In addition, each of the transistors may be turned on or turned off by the corresponding top gates (also called word lines) WL_1, WL_2, WL_3 . . . WL_8.

The memory cell pairs 20_1, 20_2, 20_3, 20_4 and 20_5 are preferably disposed in an interlayer dielectric over a semiconductor substrate which is used to accommodate other suitable devices, such as field effect transistors. One feature of the embodiment disclosed above is that the density of the devices disposed in the semiconductor substrate under the memory cell pairs 20_1, 20_2, 20_3, 20_4, and 20_5 would not be affected by the memory cell pairs 20_1, 20_2, 20_3, 20_4, and 20_5. The reason is that the memory cell pairs 20_1, 20_2, 20_3, 20_4 and 20_5 are disposed in the interlayer dielectric over the semiconductor substrate rather than disposed in the semiconductor substrate. Besides, the bit line contacts (respectively made of vias Via3_5, Via3_7, and Via3_9), which electrically couple the memory cell pairs 20_1, 20_3 and 20_5 in the first row 102 to the second bit line BL_2, are disposed alternately with the memory cell pairs in the second row 104, while the bit line contacts (respectively made of vias Via3_1 and Via3_3), which electrically couple the memory cell 20_2 and 20_4 in the second row 104 to the first bit line BL_1, are disposed alternately with the memory cell pairs in the first row 102. Accordingly, the array of the memory cell pairs 20_1, 20_2, 20_3, 20_4, and 20_5 can be arranged compactly. As a result, the number of the devices, which include memory cell pairs in the interlayer dielectric and devices disposed in the semiconductor substrate, can be increased effectively for per unit area of the semiconductor substrate.

Specifically, as shown in FIG. 2, a bit line contact Via3_5 (or bit line contacts Via3_1 and Via3_3) disposed over the bit line BL_2 (or s BL_1) may be used to couple the common S/D region 206 in the first row 102 (or the common S/D regions in the second row 104) to the bit line BL_2 disposed under and overlapping the second set of memory cell pairs 20_2 and 20_4 in the second row 104 (or the bit line BL_1 disposed under and overlapping the first set of memory cell pair 20_1 in the first row 102). At least two wirings, such as first source line SL_1 and second source line SL_2, may be respectively over the first set of memory cell pairs in the first row 102 and the second set of memory cells in the second row 104. In addition, vias Via3_2, Via3_4 and Via3_6 and metal interconnections M4_1, M4_2 and M4_3 may also be used to electrically couple the common S/D regions to the corresponding bit lines. For example, as shown in FIG. 2, the S/D contact Via3_2 disposed on the common S/D region 206 may be electrically coupled to the bit line contact Via3_5 through the metal interconnections M4_2. Preferably, the metal interconnections M4_1, M4_2 and M4_3 are extending along an orientation perpendicular to the orientation along which the vias Via3_1, Via3_2 . . . Via3_6 extend and the orientation along which the bit lines BL_1 and BL_2 extend.

Besides, as shown in FIG. 2, the memory cell pair 20_1 in the first row 102 includes a pair of field effect transistors and a pair of capacitors C1 and C2. The pair of field effect transistors may be n-type oxide semiconductor field effect transistors (OSFET) includes a pair of bottom gates BG_4 and BG_5, a bottom gate insulating layer 208 disposed on the pair of bottom gates BG_4 and BG_5, a oxide semiconductor layer 202 disposed on the bottom gate insulating layer 208, a pair of S/D regions 204, a common S/D region 206, and a pair of top gates WL_4 and WL_5 disposed on two sides of the common S/D region 206, and two top gate insulating layers 210 respectively disposed on the interfaces between the top gates WL_4 and WL_5 and the S/D regions 204 and 206. The capacitors C1 and C2 are respectively electrically coupled to the underlying S/D regions 204 of the OSFET through the capacitor contacts $C_T$.

Specifically, each of the bottom gates BG_4 and BG_5 disclosed above is a two-layered structure which made of first bottom gates BG_4a and BG_5a and second bottom gates BG_4b and BG_5b. The bottom gates BG_4 and BG_5 are respectively used to control the threshold voltage of the corresponding memory cell. In this way, the leakage current of the corresponding OSFET can be changed. Preferably, the bottom gates BG_4 and BG_5 and the top gates WL_4 and WL_5 are disposed on opposite sides of the oxide semiconductor layer 202.

The oxide semiconductor layer 202 in the OSFET may function as a channel region during the operation of the OSFET. Since the bandgap of the oxide semiconductor layer 202 is greater than or equal to 3.0 eV, the OSFET may have extremely low off-state current and low leakage current. The oxide semiconductor layer 202 may contain at least one of indium (In) and zinc (Zn). A typical example of such oxide semiconductor 202 is an In-M-Zn oxide (M is selected from Al, Ga, Y, or Sn, for example), which can be fabricated by deposition and etching processes.

Referring to FIG. 2, the capacitors C1 and C2 are stacked structures respectively having a bottom metal layer, an insulating layer, and a top metal layer. The metal layers and the insulating layer of each capacitor C1 and C2 can be fabricated by deposition and etching processes after the fabricating of the oxide semiconductor layer 202.

The memory device 10 shown in FIG. 2 may be fabricated in a back-end-of-line (BEOL) process. In other words, the memory cell pairs in the memory device 10 may be disposed in layers of interlayer dielectric over the semiconductor substrate. For example, bit lines BL_1 and BL_2 may be metal stripes along axis X and disposed on a first inter layer dielectric. Vias Via1_1 and Via1_3 may be vias extending along axis Z disposed over the bit lines BL_1 and BL_2, and may be embedded in a second inter layer dielectric. Bottom gates BG_1, BG_2 . . . BG_8 are metal stripes along axis Y and disposed on the second inter layer dielectric. Vias Via3, the bit line contacts Via3_1, Via3_3 and Via3_5, and the common source drain contacts Via3_2, Via3_4 and Via3_6 may be vias extending along axis Z, which are embedded in a third inter layer dielectric and disposed over the second inter layer dielectric. The metal interconnections M4_1, M4_2 and M4_3 may be metal stripes along Y and disposed on the third interlayer dielectric. The capacitors C1 and C2 are embedded in a forth interlayer dielectric. The source lines SL_1 and SL_2 may be metal stripes along X and disposed on the forth interlayer dielectric.

Since the density of the devices disposed in the semiconductor substrate would not be affected by the memory cell pairs 20_1, 20_2, 20_3, 20_4, and 20_5, the number of the devices, which include memory cell pairs in the interlayer dielectric and devices disposed in the semiconductor substrate, can be increased effectively for per unit area of the semiconductor substrate.

Figure 3:
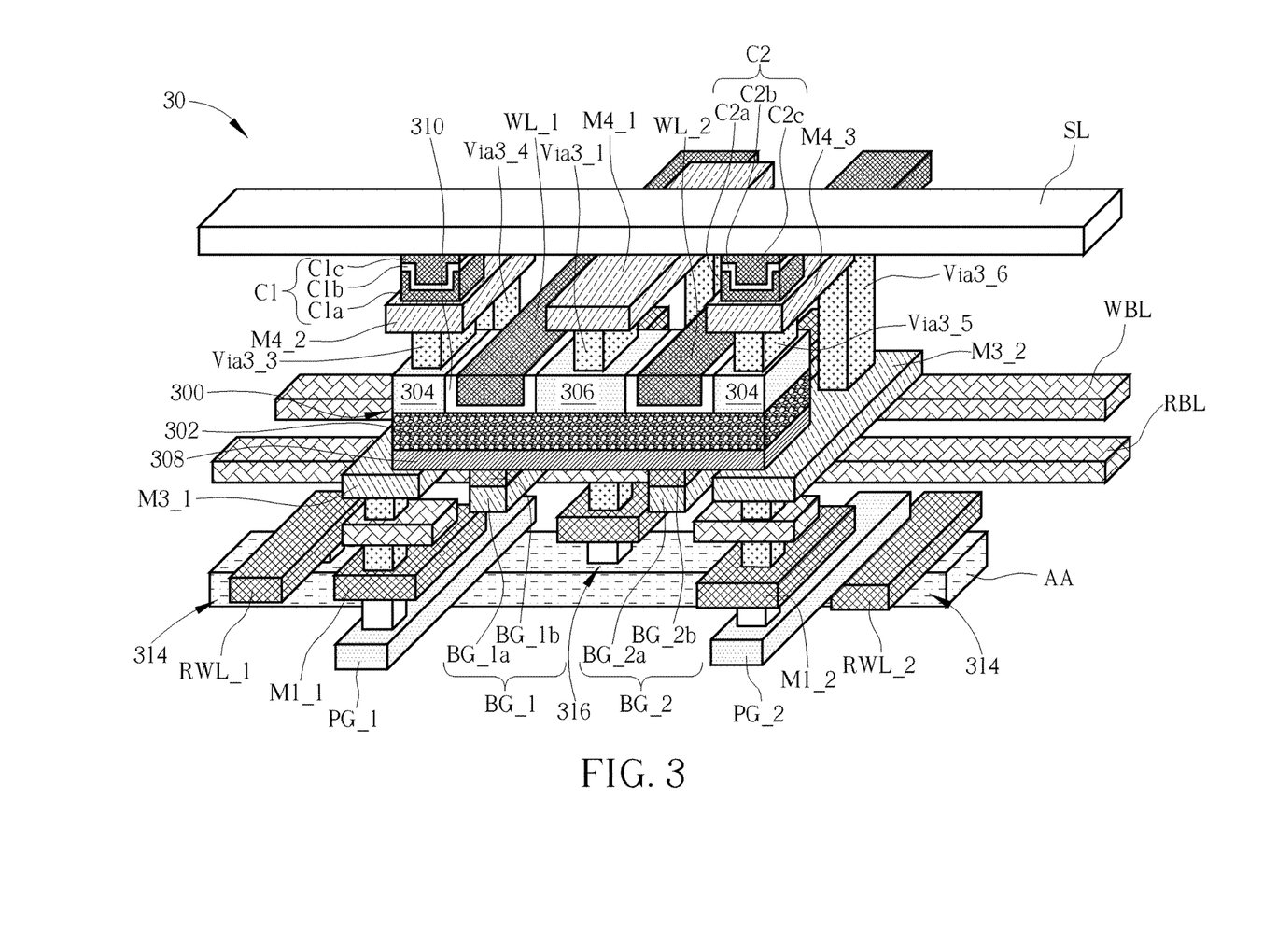
FIG. 3 is a perspective view of an array of DRAM cells, where each of the cells is a two-transistors-one-capacitor (2T1C) gain cell, according to one embodiment of the invention.

FIG. 3 is a perspective view of an array of DRAM cells according to one embodiment of the invention, where each of the cells is a two-transistors-one-capacitor (2T1C) gain cell. The memory device 30 shown in the embodiment of FIG. 3 is similar to the memory device 10 shown in the embodiment of FIG. 2. The main difference between the memory devices 10 and 30 is that each memory cell of each memory cell pair shown in FIG. 2 consists of one transistor and one capacitor, while each memory cell of each memory cell pair shown in FIG. 3 is a gain cell consisting of two transistors and one capacitor.

In particular, a pair of OSFETs 300 may be n-type OSFETs including a pair of bottom gates BG_1 and BG_2, a bottom gate insulating layer 308 disposed on the pair of bottom gates BG_1 and BG_2, an oxide semiconductor layer 302 disposed on the bottom gate insulating layer 308, a pair of S/D regions 304, a common S/D region 306, and a pair of top gates WL_1 and WL_2 disposed on two sides of the common S/D region 306, and two top gate insulating layers 310 respectively disposed on the interfaces between the top gates WL_1 and WL_2 and the S/D regions 304 and 306. The capacitors C1 and C2 are respectively electrically coupled to the underlying S/D regions 304 of the OSFETs through capacitor contacts (or called vias Via3_3 and Via3_5).

Specifically, each of the bottom gates BG_1 and BG_2 disclosed above is a two-layered structure which made of first bottom gates BG_1a and BG_2a and second bottom gates BG_1b and BG_2b. The bottom gates BG_1 and BG_2 are respectively used to control the threshold voltage of the corresponding memory cell. In this way, the leakage current of the corresponding OSFET can be changed. Preferably, the bottom gates BG_1 and BG_2 and the top gates WL_1 and WL_2 are disposed on opposite sides of the oxide semiconductor layer 302.

The oxide semiconductor layer 302 in the OSFET may function as a channel region during the operation of the OSFET. Since the bandgap of the oxide semiconductor layer 302 is greater than or equal to 3.0 eV, the OSFET may have extremely low off-state current and low leakage current. The oxide semiconductor layer 302 may contain at least one of indium (In) and zinc (Zn). A typical example of such oxide semiconductor 302 is an In-M-Zn oxide (M is selected from Al, Ga, Y, or Sn, for example), which can be fabricated by deposition and etching processes.

The capacitors C1 and C2 are stacked structures, such as metal-insulation-metal (MIM) structures, respectively having a bottom metal layer C1a and C2a, an insulating layer C1b and C2b, and a top metal layer C1c and C2c.

The common S/D region 306 of the pair of OSFETs 300 may be electrically coupled to a write bit line WBL through a vertically disposed common S/D contact Via3_1, a horizontally disposed metal interconnection M4_1, and a bit line contact Via3_2. Preferably, the pair of OSFETs 300 and the bit line contact Via3_2 are disposed in different rows.

Furthermore, one electrode, such as the top meal layer C1c and C2c, of each capacitor C1 and C2 may be electrically coupled to a source line SL above the pair of OSFETs 300, and another electrode, such as the bottom metal layer C1a and C2a, of each capacitor C1 and C2 may be electrically coupled to a gate electrode PG_1 and PG_2 of devices embedded in an active region AA of a semiconductor substrate. Specifically, the bottom metal layers C1a and C2a of the capacitors C1 and C2 may be electrically coupled to the gate electrodes PG_1 and PG_2 through metal interconnections M4_2 and M4_3, vias Via3_4 and Via3_6, metal interconnections M3_1 and M3_2, and metal interconnections M1_1 and M1_2. Besides, the devices embedded in an active region AA further include a pair of S/D regions 314 respectively disposed on one side of the gate electrode PG_1 and PG_2 and a common S/D region 316. The S/D regions 314 may be respectively electrically coupled to read word lines RWL_1 and RWL_2, and the common S/D region 316 may be electrically coupled to read bit lines RBL. It should be noted that the source line SL, the write bit line WBL, the read bit line RBL, and the active region AA preferably extend along the same orientation, such as a first orientation. The metal interconnections M4_1, M4_2 and M4_3, the metal interconnections M3_1 and M3_2, and the gate electrodes PG_1 and PG_2 preferably extend along the same orientation, such as a second orientation. The first orientation is perpendicular to the second orientation.

Figure 4:
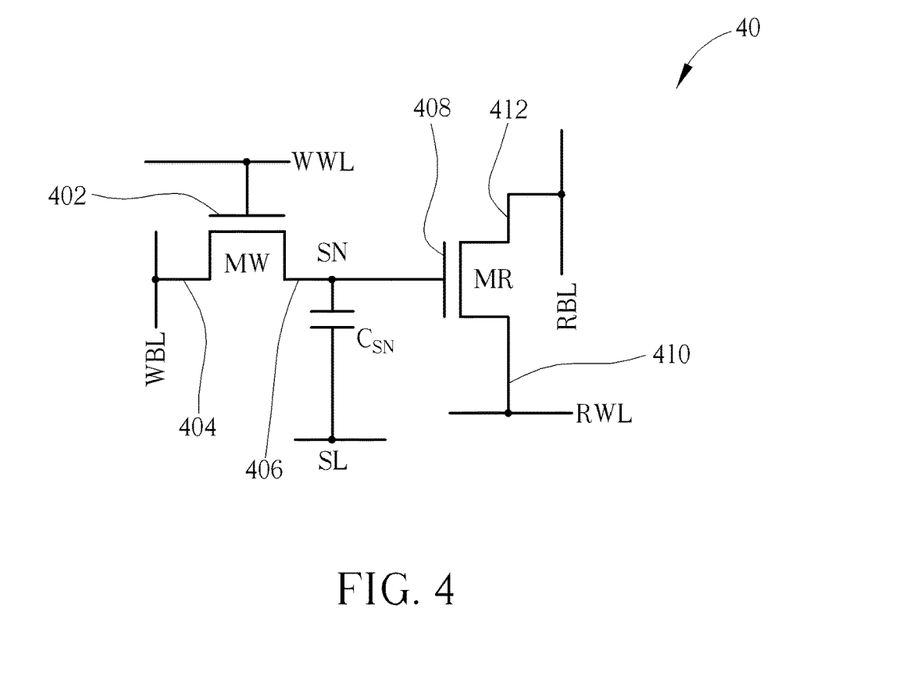
FIG. 4 is a circuit diagram showing a 2T1C gain cell, according to one embodiment of the invention.

FIG. 4 is a circuit diagram showing a 2T1C gain cell according to one embodiment of the invention. It should be noted that the circuit diagram of FIG. 4 is corresponding to a right-half portion or a left-half portion of the structure shown in FIG. 3. A transistor MW shown in FIG. 4 corresponds to one OSFET in the OSFET pair shown in FIG. 3 and includes a gate electrode 402, and a pair of S/D regions 404 and 406. The gate electrode 402 is electrically coupled to a write word line WWL (corresponding to the write word line WWL shown in FIG. 3). The S/D region 404 is electrically coupled to the write bit line WBL (corresponding to the write bit line WBL shown in FIG. 3), and the S/D region 406 is electrically coupled to a storage node SN. A capacitor $C_{SN}$ corresponds to the capacitor C1 and C2 shown in FIG. 3, where one electrode of the capacitor $C_{SN}$ is electrically coupled to the storage node SN and another electrode of the capacitor $C_{SN}$ is electrically coupled to a source line SL (corresponding to the source line SL shown in FIG. 3). An n-type FET MR shown in FIG. 4 corresponds to the embedded device shown in FIG. 3. The n-type FET MR includes a gate electrode 408, and a pair of S/D regions 410 and 412. The gate electrode 408 (corresponding to one of the gate electrodes PG_1 and PG_2 shown in FIG. 3) is electrically coupled to the storage node SN. The S/D region 410 (corresponding to one of the S/D regions 314 shown in FIG. 3) is electrically coupled to the read word line RWL (corresponding to the read word line RWL shown in FIG. 3), and the S/D region 412 (corresponding to the common S/D region 306 shown in FIG. 3) is electrically coupled to the read bit line RBL (corresponding to the read bit line RBL shown in FIG. 3). Because the transistor MW is a OSFET with low on-current, the transistor MR may be used to boost the signal read out from the capacitor $C_{SN}$.

Figure 5:
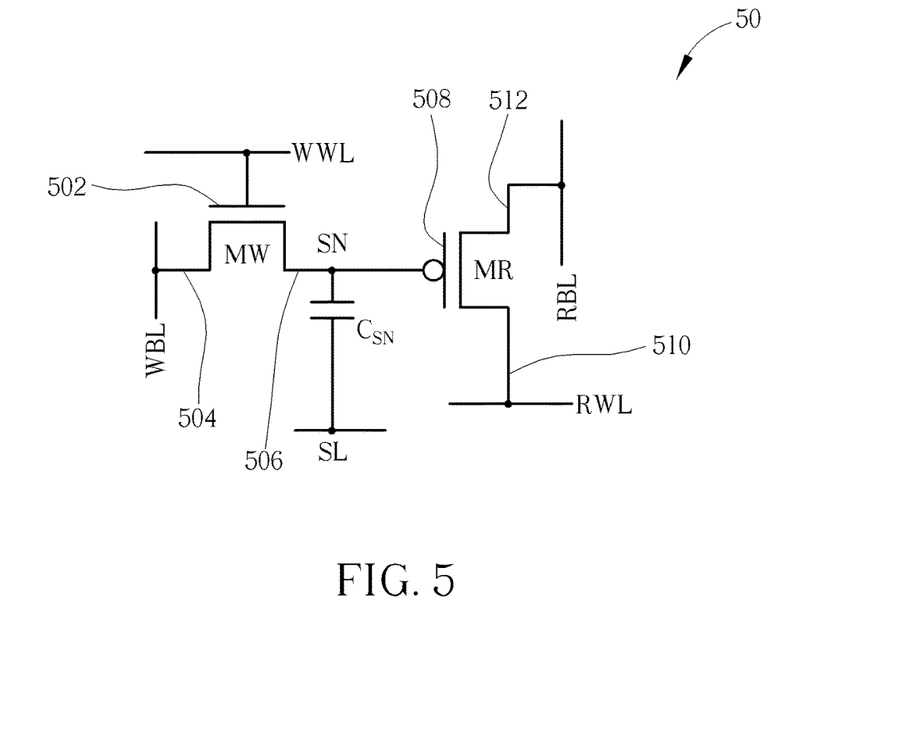
FIG. 5 is a circuit diagram showing a 2T1C gain cell, according to one embodiment of the invention.

FIG. 5 is a circuit diagram showing a 2T1C gain cell, according to one embodiment of the invention. It should be noted that the circuit diagram of FIG. 5 is corresponding to a right-half portion or a left-half portion of the structure shown in FIG. 3. A transistor MW shown in FIG. 5 corresponds to one OSFET in the OSFET pair shown in FIG. 3 and includes a gate electrode 502, and a pair of S/D regions 504 and 506. The gate electrode 502 is electrically coupled to a write word line WWL (corresponding to the write word line WWL shown in FIG. 3). The S/D region 504 is electrically coupled to the write bit line WBL (corresponding to the write bit line WBL shown in FIG. 3), and the S/D region 506 is electrically coupled to a storage node SN. A capacitor $C_{SN}$ corresponds to the capacitor C1 and C2 shown in FIG. 3, where one electrode of the capacitor $C_{SN}$ is electrically coupled to the storage node SN and another electrode of the capacitor $C_{SN}$ is electrically coupled to a source line SL (corresponding to the source line SL shown in FIG. 3). A p-type FET MR shown in FIG. 5 corresponds to the embedded device shown in FIG. 3 and includes a gate electrode 508, and a pair of S/D regions 510 and 512. The gate electrode 508 (corresponding to one of the gate electrodes PG_1 and PG_2 shown in FIG. 3) is electrically coupled to the storage node SN. The S/D region 510 (corresponding to one of the S/D regions 314 shown in FIG. 3) is electrically coupled to the read word line RWL (corresponding to the read word line RWL shown in FIG. 3), and the S/D region 512 (corresponding to the common S/D region 306 shown in FIG. 3) is electrically coupled to the read bit line RBL (corresponding to the read bit line RBL shown in FIG. 3). Because the transistor MW is an OSFET with low on-current, the transistor MR may be used to boost the signal read out from the capacitor $C_{SN}$.

Figure 6:
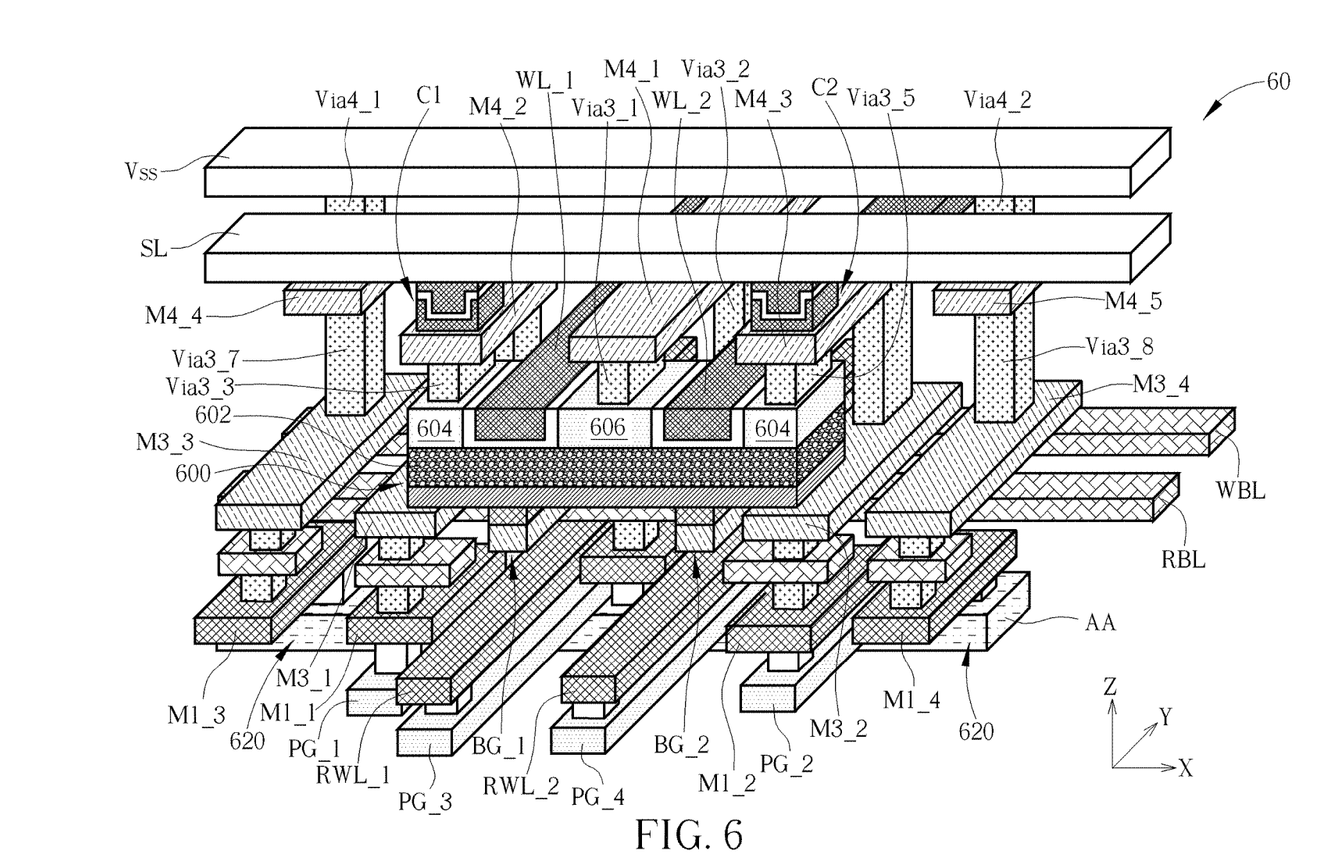
FIG. 6 is a perspective view of an array of DRAM cells, where each of the cells is a three-transistors-one-capacitor (3T1C) gain cell, according to one embodiment of the invention.

FIG. 6 is a perspective view of an array of DRAM cells according to one embodiment of the invention, where each of the cells is a three-transistors-1-capacitor (3T1C) gain cell. The memory device 60 shown in the embodiment of FIG. 6 is similar to the memory device 30 shown in the embodiment of FIG. 3. The main difference between the memory devices 60 and 30 is that each memory cell shown in FIG. 6 is a gain cell consisting of three transistors and one capacitor.

In particular, a pair of OSFETs 600 may be n-type OSFETs including a pair of bottom gates BG_1 and BG_2, a bottom gate insulating layer 608 disposed on the pair of bottom gates BG_1 and BG_2, an oxide semiconductor layer 602 disposed on the bottom gate insulating layer 608, a pair of S/D regions 604, a common S/D region 606, and a pair of top gates WL_1 and WL_2 disposed on two sides of the common S/D region 606, and two top gate insulating layers 610 respectively disposed on the interfaces between the top gates WL_1 and WL_2 and the S/D regions 604 and 606. The capacitors C1 and C2 are respectively electrically coupled to the underlying S/D regions 604 of the OSFETs through capacitor contacts (or called vias Via3_3 and Via3_5).

The common S/D region 606 of the OSFETs 600 may be electrically coupled to a write bit line WBL through a vertically disposed common S/D contact Via3_1, a horizontally disposed metal interconnection M4_1, and a bit line contact Via3_2. Preferably, the OSFET pair 600 and the bit line contact Via3_2 are disposed in different rows.

Furthermore, one electrode, such as the top meal layer, of each of the capacitor C1 and C2 may be electrically coupled to a source line SL above the OSFET pair 600, and another electrode, such as the bottom metal layer, of each of the capacitor C1 and C2 may be electrically coupled to a gate electrode PG_1 and PG_2 of devices embedded in an active region AA of a semiconductor substrate. Specifically, the bottom metal layers of the capacitor C1 and C2 may be electrically coupled to the gate electrodes PG_1 and PG_2 through metal interconnections M4_2 and M4_3, vias Via3_4 and Via3_6, metal interconnections M3_1 and M3_2, and metal interconnections M1_1 and M1_2.

Besides, the devices embedded in an active region AA may include four transistors, and each two of the transistors may belong to one memory cell. Specifically, a wiring $V_{SS}$ disposed in the second row may be electrically coupled to a pair of outmost S/D regions 620 through vias Via4_1 and Via4_2, metal interconnections M4_4 and M4_5, vias Via3_7 and Via3_8, metal interconnections M3_3 and M3_4, and metal interconnections M1_3 and M1_4. The read word lines RWL_1 and RWL_2 may be disposed over the middle of the active region AA. It should be noted that the source line SL, the wiring $V_{SS}$, the write bit line WBL, the read bit line RBL, and the active region AA preferably extend along the same orientation, such as a first orientation X. The metal interconnections M4_1, M4_2, M4_3, M4_4 and M4_5, the metal interconnections M3_1, M3_2, M3_3, and M3_4, and the gate electrodes PG_1, PG_2, PG_3 and PG_4 preferably extend along the same orientation, such as a second orientation Y. The first orientation X is perpendicular to the second orientation Y.

Figure 7:
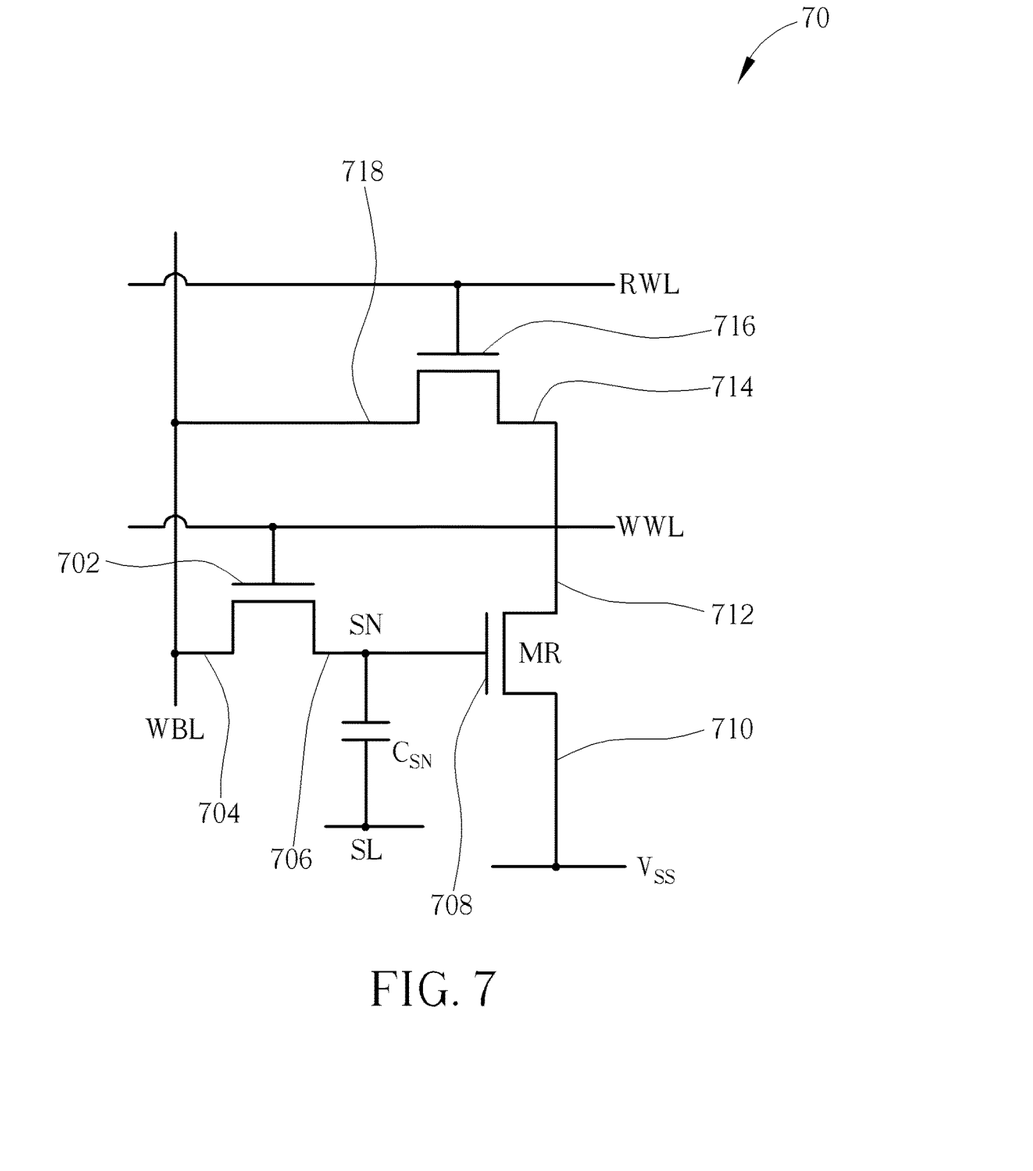
FIG. 7 is a circuit diagram showing a 3T1C gain cell, according to one embodiment of the invention.

FIG. 7 is a circuit diagram showing a 3T1C gain cell according to one embodiment of the invention. It should be noted that the circuit diagram of FIG. 7 is corresponding to a right-half portion or a left-half portion of the structure shown in FIG. 6. A transistor including a gate electrode 702, a pair of S/D regions 704 and 706 corresponds to one OSFET in the OSFET pair shown in FIG. 6. The gate electrode 702 is electrically coupled to a write word line WWL (corresponding to the write word line WWL shown in FIG. 6). The S/D region 704 is electrically coupled to the write bit line WBL (corresponding to the write bit line WBL shown in FIG. 6), and the S/D region 706 is electrically coupled to a storage node SN. A capacitor $C_{SN}$ corresponds to one of the capacitors C1 and C2 shown in FIG. 6, where one electrode of the capacitor $C_{SN}$ shown in FIG. 7 is electrically coupled to the storage node SN and another electrode of the capacitor $C_{SN}$ is electrically coupled to a source line SL (corresponding to the source line SL shown in FIG. 6). An n-type FET including a gate electrode 708, a pair of S/D regions 710 and 712 corresponds to one of the embedded devices shown in FIG. 6. The gate electrode 708 (corresponding to one of the gate electrodes PG_1 and PG_2 shown in FIG. 6) is electrically coupled to the storage node SN. The S/D region 710 (corresponding to one of the S/D regions 620 shown in FIG. 6) is electrically coupled to the wiring $V_{SS}$ (corresponding to the wiring $V_{SS}$ shown in FIG. 6), and the S/D region 712 is electrically coupled to the write bit line WBL through another transistor including gate electrode 716, a pair of S/D regions 714 and 718. The gate electrode 716 (corresponding to one of the gate electrodes PG_3 and PG_4 shown in FIG. 6) is electrically coupled to a read word line RWL (corresponding to the read word line RWL shown in FIG. 6).

According to the above embodiments, FETs embedded in the semiconductor substrate are used to boost the signal read out from the capacitor $C_{SN}$. Accordingly, even if the OSFETs with low on-current are used in the memory cells, the signal read from the memory cells can still fulfill the requirements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An array of dynamic random access memory (DRAM) cells, comprising:
a first set of memory cell pairs in a first row, and
a second set of memory cell pairs in a second row, disposed adjacent to the first set of memory cell pairs, wherein each of the memory cell pairs in the second row comprise a common S/D region,
a first set of bit line contacts in the first row, each of the first set of bit line contacts electrically coupled to each of the common S/D regions of the memory cell pairs in the second row respectively; and
a first bit line disposed under the first set of memory cell pairs, wherein the first set of bit line contacts are coupled to the first bit line.

2. The array of DRAM cells of claim 1, wherein each memory cell pair in the first row further comprises a common S/D region, and the array of dynamic random access memory cells further comprises:
a second set of bit line contacts in the second row, each of the second set of bit line contacts electrically coupled to each of the common S/D regions of the memory cell pairs in the first row respectively.

3. The array of DRAM cells of claim 2, further comprising:
a first set of common S/D contacts, respectively disposed on the common S/D regions of the first set of memory cell pairs, wherein each of the first set of common S/D contacts electrically couple each of the common S/D regions of the first set of memory cell pairs to each of the second set of bit line contacts.

4. The array of DRAM cells of claim 1, wherein the first bit line extends along a first orientation, and the first set of memory cell pairs are distributed along the first orientation.

5. The array of DRAM cells of claim 1, wherein the first bit line overlaps the first set of memory cell pairs.

6. The array of DRAM cells of claim 1, further comprising:
a second bit line disposed under the second set of memory cell pairs, wherein the second set of bit line contacts are coupled to the second bit line.

7. The array of DRAM cells of claim 6, wherein the second bit line overlaps the second set of memory cell pairs.

8. The array of DRAM cells of claim 1, wherein the first bit line extends along a first orientation, and the first set of memory cell pairs are distributed along the first orientation, the array of DRAM cells further comprises:
a set of wirings, electrically coupling each of the common S/D regions in a second row to each of the first set of bit line contacts in the first row, wherein each of the wirings extends along a second orientation perpendicular to the first orientation.

9. The array of DRAM cells of claim 1, wherein each of the first set of memory cell pairs further comprises a pair of capacitors, each of the capacitors comprises an electrode electrically connected to a first source line disposed above the capacitors.

10. The array of DRAM cells of claim 9, wherein the first bit line and the first source line extend along a same orientation.

11. The array of DRAM cells of claim 1, wherein each of the memory cells comprises a transistor comprising an oxide semiconductor layer, the oxide semiconductor layer comprises In, Ga, and Zn.

12. The array of DRAM cells of claim 11, wherein the transistor further comprises a top gate and a bottom gate respectively disposed on opposite sides of the oxide semiconductor layer.

13. The array of DRAM cells of claim 1, wherein each memory cell in each of the memory cell pairs is a gain cell comprising at least two transistors and one capacitor.

14. The array of DRAM cells of claim 1, wherein each memory cell in each of the memory cell pairs comprises:
an oxide semiconductor field effect transistor (FET) comprising at least a S/D region, wherein the oxide semiconductor FET is disposed over a semiconductor substrate;
a capacitor electrically coupled to the S/D region of the oxide semiconductor FET; and
a first n-type FET disposed under the oxide semiconductor FET, wherein the first n-type FET comprises a gate electrically coupled to the S/D region of the oxide semiconductor FET and the capacitor.

15. The array of DRAM cells of claim 14, wherein the first n-type FET further comprises a S/D region, and each memory cell further comprises:
a second n-type FET disposed under the oxide semiconductor FET, wherein the second n-type FET comprises a S/D region electrically coupled to the S/D region of the first n-type FET.

16. The array of DRAM cells of claim 15, wherein the S/D region of the first n-type FET and the S/D region of the second n-type FET are disposed in the semiconductor substrate.

17. The array of DRAM cells of claim 1, wherein each memory cell in the memory cell pair comprises:
an oxide semiconductor FET comprising at least a S/D region and disposed over a semiconductor substrate;
a capacitor electrically coupled to the S/D region of the oxide semiconductor FET; and
a p-type FET disposed under the oxide semiconductor FET, wherein the p-type FET comprises a gate electrically coupled to the S/D region of the oxide semiconductor FET and the capacitor.

18. The array of DRAM cells of claim 1, wherein each memory cell in each of the memory cell pairs comprises an oxide semiconductor field effect transistor (FET) and a capacitor, wherein the oxide semiconductor FET and the capacitor are disposed above a semiconductor substrate, and each of the capacitors comprises two parallel metal electrodes.

* * * * *